United States Patent
Bonafos et al.

(10) Patent No.: US 7,127,015 B2
(45) Date of Patent: Oct. 24, 2006

(54) DIGITAL FILTER FOR REDUCING VOLTAGE PEAKS

(75) Inventors: Xavier David Bonafos, Grasse (FR); Jean-Michel Tanguy, Nice (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 774 days.

(21) Appl. No.: 10/270,343

(22) Filed: Oct. 11, 2002

(65) Prior Publication Data

US 2003/0091135 A1    May 15, 2003

(30) Foreign Application Priority Data

Oct. 16, 2001   (FR) .................................. 01 13333

(51) Int. Cl.
*H04B 1/10*   (2006.01)

(52) U.S. Cl. ...................... 375/350; 375/346; 455/307; 708/300

(58) Field of Classification Search ................ 375/350, 375/346, 307, 300
See application file for complete search history.

(56) References Cited

U.S. PATENT DOCUMENTS

| | | | |
|---|---|---|---|
| 4,736,370 A * | 4/1988 | Hirome et al. .............. 370/428 |
| 5,610,897 A * | 3/1997 | Yamamoto et al. ..... 369/124.03 |
| 5,875,212 A * | 2/1999 | Fleek et al. .................. 375/329 |
| 5,878,094 A * | 3/1999 | Nowak et al. ............... 375/349 |
| 6,421,534 B1 * | 7/2002 | Cook et al. .................. 455/313 |
| 6,628,999 B1 * | 9/2003 | Klaas et al. .................. 700/94 |
| 6,700,943 B1 * | 3/2004 | Miller ......................... 375/354 |
| 6,937,084 B1 * | 8/2005 | Bowling ...................... 327/393 |

* cited by examiner

*Primary Examiner*—Jean B. Corrielus
*Assistant Examiner*—Erin M. File
(74) *Attorney, Agent, or Firm*—Aaron Waxler; Paul Im

(57) ABSTRACT

The present invention relates to a digital filter suitable for receiving a digital input signal (INPUT(G)) comprising a voltage peak also known as glitch (G). It is characterized in that it comprises:
a delay line (T) adapted to produce a delayed digital input signal (INPUT(G)+Δt),
rising edge (PD) and falling edge (ND) detectors adapted to produce rising (P) and falling (N) edge indicator signals respectively from the delayed digital input signal (INPUT (G)+Δt),
first (M1) and second (M2) mixing means adapted to produce rising (P') and falling (N') edge filter indicator signals respectively from said digital input signal (INPUT(G)) and said rising (P) and falling (N) edge indicator signals respectively,
third mixing means (M3) adapted to produce a digital output signal (OUTPUT) without a glitch from the rising edge filter indicator signal (P') and from the falling edge filter indicator signal (N').

7 Claims, 5 Drawing Sheets

DIGITAL FILTER FOR REDUCING VOLTAGE PEAKS

Figure 1:
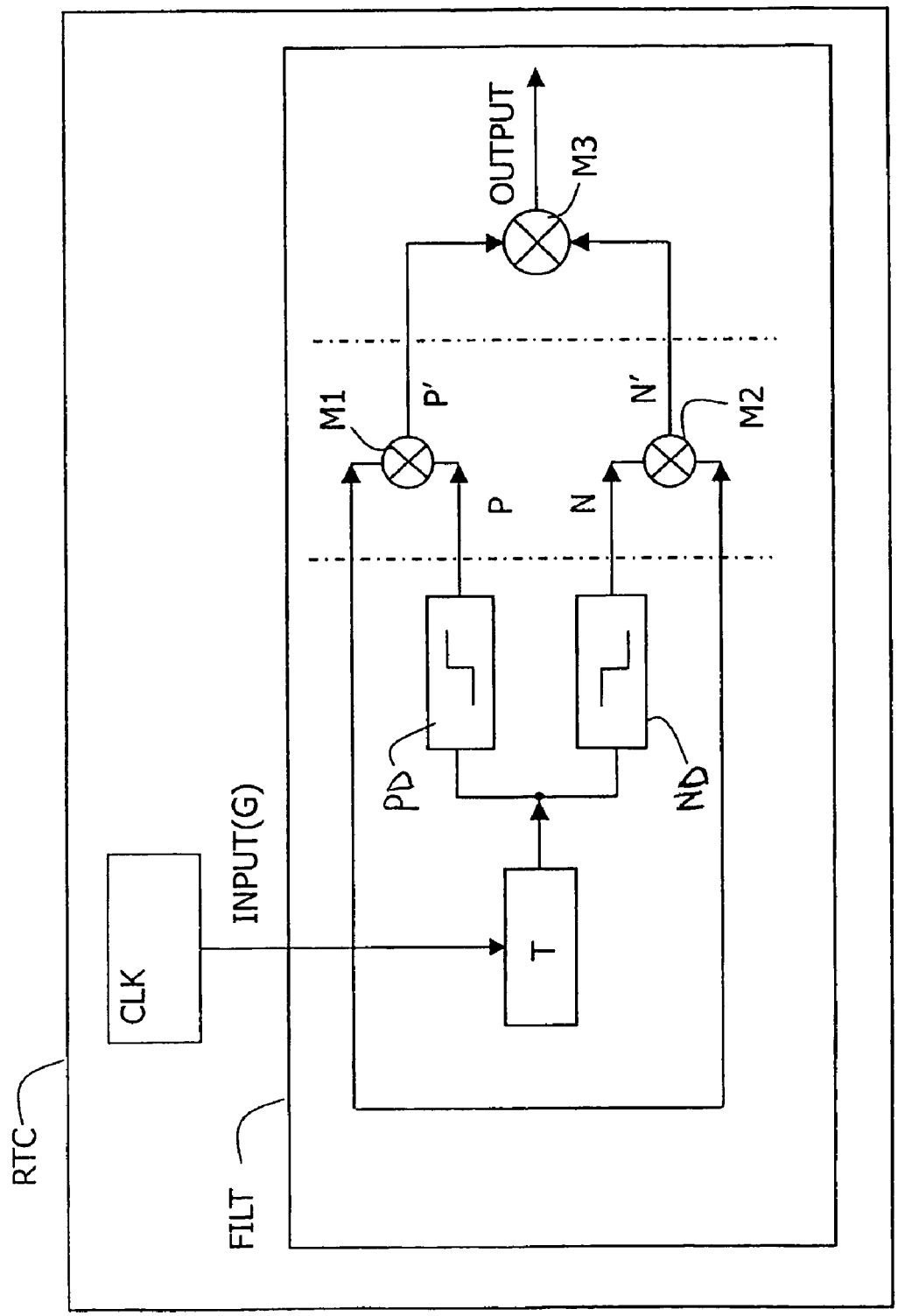

The present invention relates to a digital filter suitable for receiving a digital input signal, comprising a rising edge detector, a falling edge detector, and a delay line adapted to delay said digital input signal, said digital input signal comprising a voltage peak. The invention also relates to a digital filtering method adapted to filter voltage peaks included in said digital signal.

The invention finds a particular application notably in mobile telephones.

U.S. Pat. No. 5,878,094 filed on 19 Mar. 1999 describes a digital signal filtering circuit suitable for receiving an input signal and suitable for producing an output signal. The filtering circuit comprises a delay line, a rising edge detector and a falling edge detector arranged so that they prevent the input signal from returning to a previous state for a limited period just after said signal has changed state. Consequently, if a voltage peak exists during this limited period, it is filtered.

Although this state of the art makes it possible to filter a voltage peak, it filters the voltage peaks only for a limited period after a change in edge. Consequently, should a voltage peak appear in the middle of a high or low state, it would not be filtered.

Thus one technical problem to be resolved by the object of the present invention is to propose a digital filter suitable for receiving a digital input signal, comprising a rising edge detector, a falling edge detector, a delay line adapted to delay said digital input signal, said digital input signal comprising a voltage peak, and an associated digital signal processing method, which make it possible to eliminate a voltage peak from said digital input signal, at any time in a high or low state of said digital input signal.

One solution to the technical problem posed is characterized, according to a first object of the present invention, in that:

the rising edge detector is also adapted to produce a rising edge indicator signal from the delayed digital input signal, the falling edge detector is also adapted to produce a falling edge indicator signal from the delayed digital input signal, and in that it comprises first mixing means adapted to produce a rising edge filter indicator signal from said digital input signal and said rising edge indicator signal, second mixing means adapted to produce a falling edge filter indicator signal from said digital input signal and said falling edge indicator signal, and third mixing means adapted to produce a digital output signal without a voltage peak from the rising edge filter indicator signal and the falling edge filter indicator signal.

According to a second object of the present invention, this solution is characterized in that the digital signal processing method comprises the steps of:

delaying said digital input signal and producing a delayed digital input signal, detecting a rising edge coming from the delayed digital input signal and producing a rising edge indicator signal, detecting a falling edge coming from the delayed digital input signal and producing a falling edge indicator signal, producing a rising edge filter indicator signal from said digital input signal and said rising edge indicator signal, producing a falling edge filter indicator signal from said digital input signal and said falling edge indicator signal, and producing a digital output signal without a voltage peak from the rising edge filter indicator signal and the falling edge filter indicator signal.

Thus, as will be seen in detail below, such a digital filter makes it possible to eliminate a voltage peak at any time. In addition, it has the advantage of not using the external clock. Finally, it has the advantage of using simple means.

The invention will be further described with reference to examples of embodiments shown in the drawings to which, however, the invention is not restricted.

Figure 2:
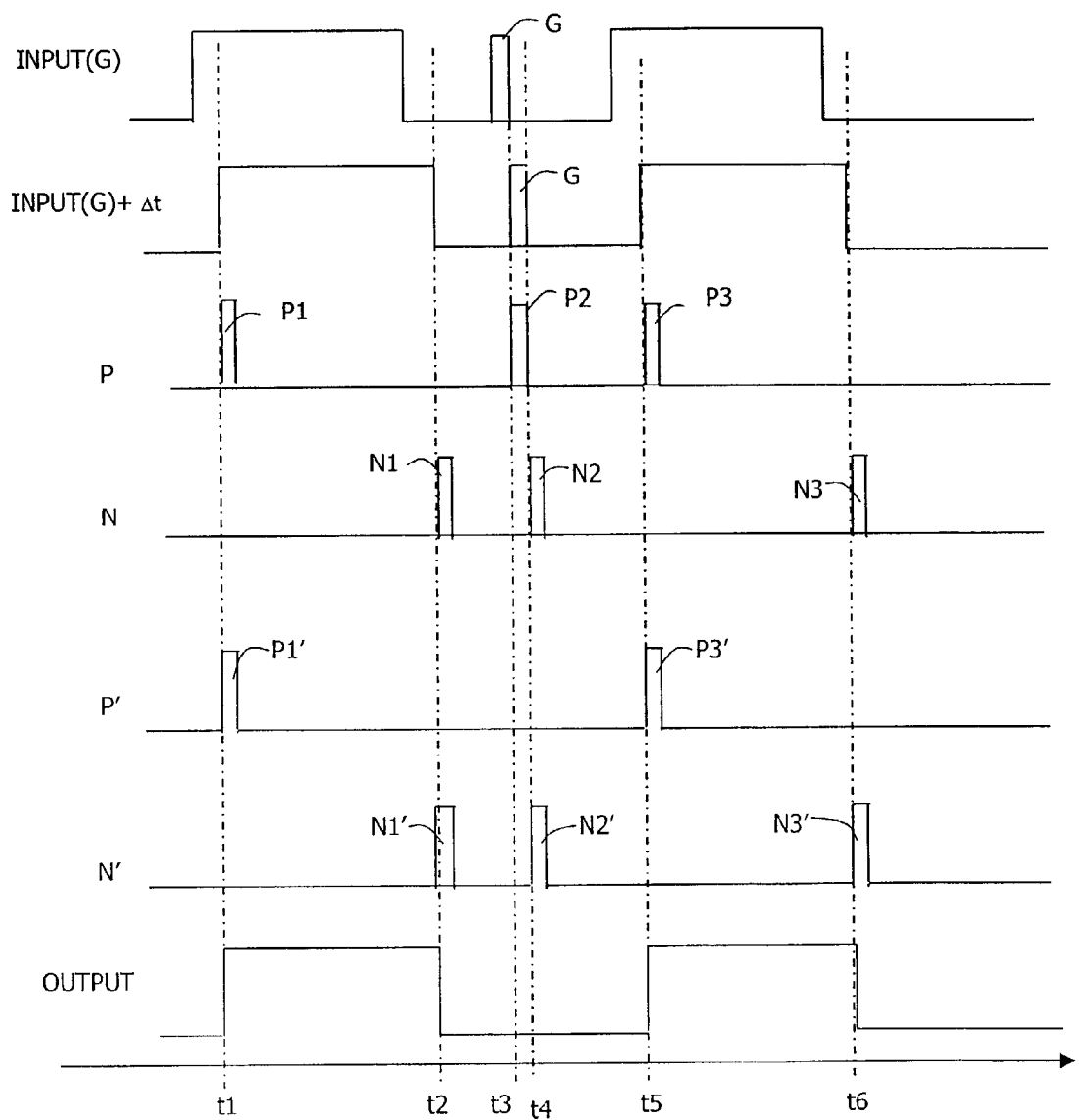
Figure 3:
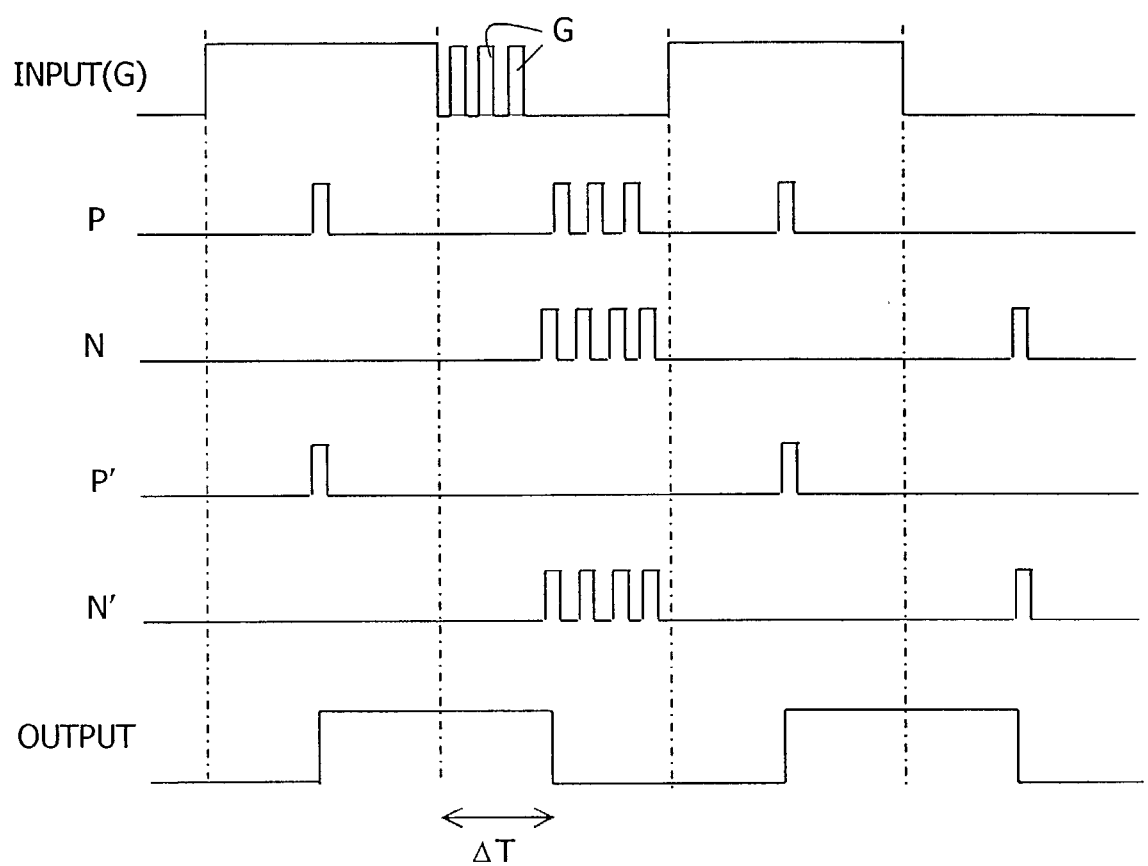
Figure 4:
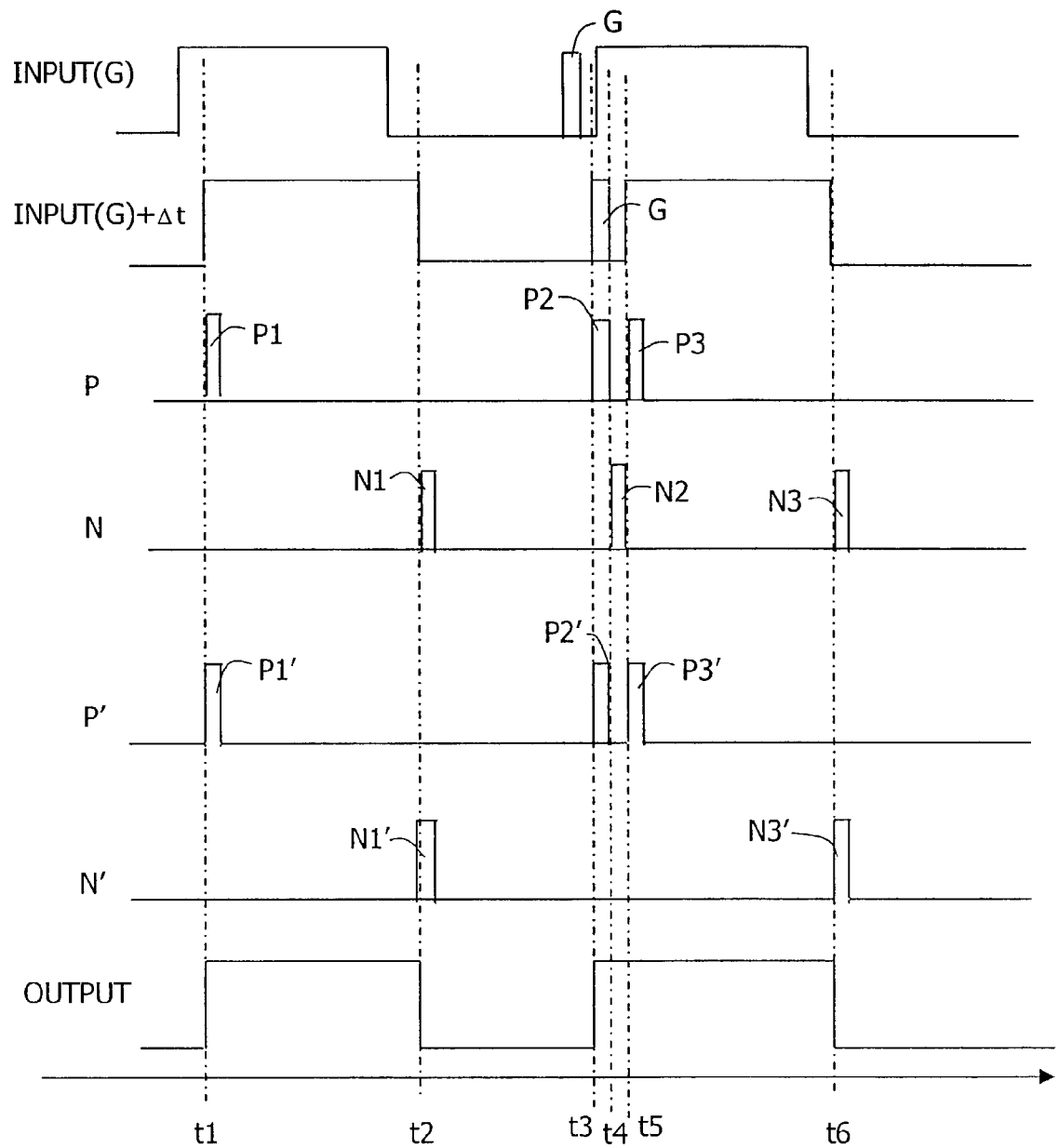
Figure 5:
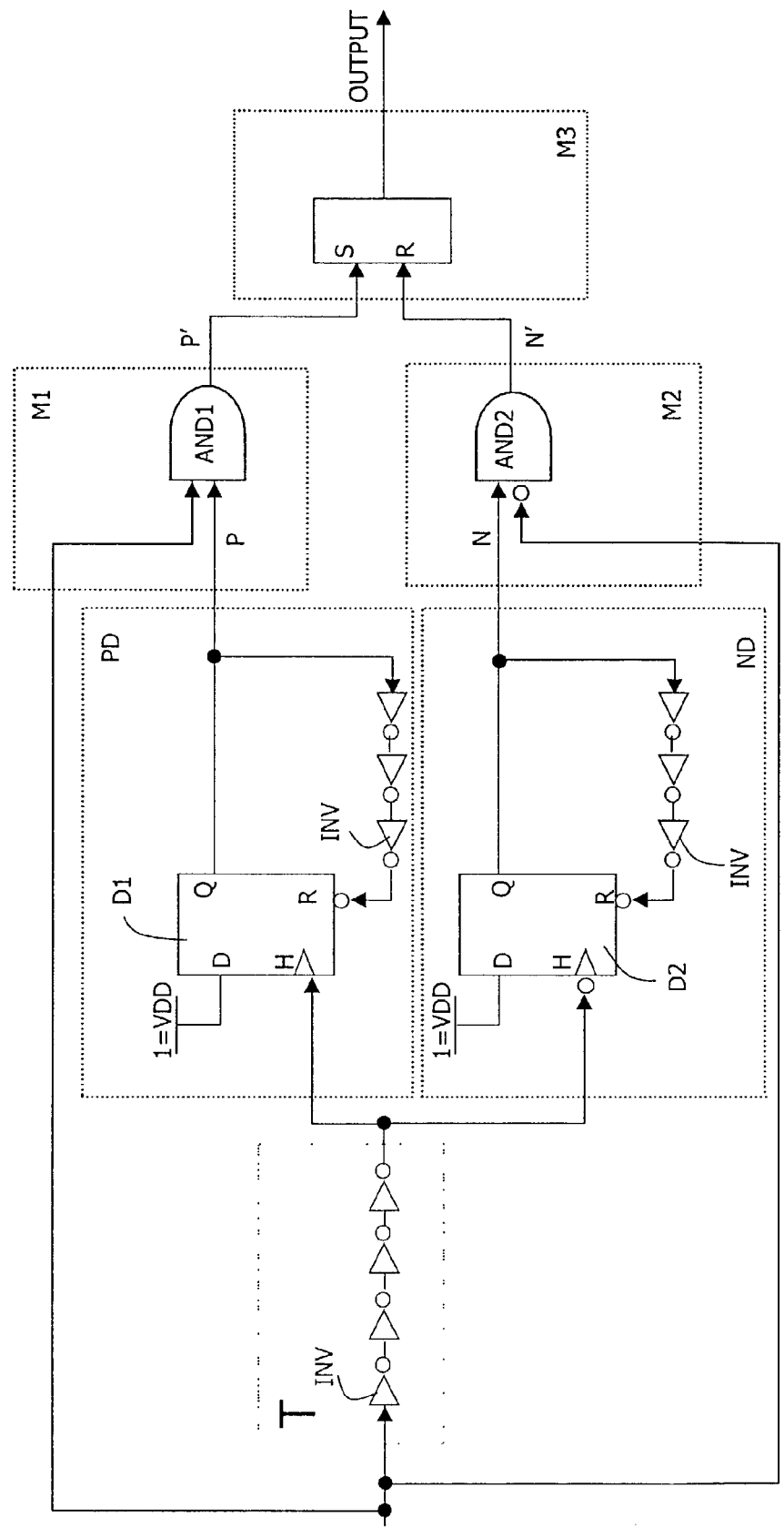

FIG. 1 diagrammatically illustrates an architecture of the digital filter according to the invention, FIG. 2 is a first diagram representing a digital input signal, edge indicator signals, edge indicator filter signals and an output signal, controlled by the digital filter of FIG. 1, FIG. 3 a second diagram showing a digital input signal including several voltage peaks between two states, and rising edge and falling edge filter indicator signals and an output signal, controlled by the digital filter of FIG. 1, FIG. 4 is a diagram showing an edge effect phenomenon on the signals controlled by the digital filter of FIG. 1, and FIG. 5 shows an embodiment of the digital filter of FIG. 1.

The present explanation of the invention relates to an example of a digital filter used in the field of mobile telephony. A portable telephone, also known as a mobile, includes a module RTC serving to control a clock giving the time. This module is also referred to as a "Real Time Clock". The module RTC comprises connections PAD and a squared signal generator CLK. A connection PAD comprises an oscillator which, coupled with an external crystal, creates a sinusoidal analog signal with a fixed frequency of 32 kHz. The squared signal generator CLK (also referred to as a "clock squarer"), which serves as an internal clock, converts this sinusoidal analog signal into a digital input signal INPUT(G). An oscillator is a sensitive component, for example with current peaks in the module RTC, and with electromagnetic factors. This sensitivity results in a deformation of the sinusoidal signal. This deformation causes an appearance of voltage peaks G (normally referred to as "glitches") in the digital input signal INPUT(G). At the output of the squared signal generator CLK, in order to provide a signal free from glitches G, the digital filter FILT is integrated with said module RTC.

FIG. 1 depicts a diagram of an architecture of the digital filter FILT. Said filter comprises:

a delay line T,
a rising edge detector PD,
a falling edge detector ND,
first mixing means M1,
second mixing means M2,
third mixing means M3.

The filter receives the digital input signal INPUT(G), which may include glitches. These glitches may be harmful to the correct functioning of the mobile telephone clock. This is because, because of the glitches, the clock advances a few seconds too much. The time thus marked on the clock is not exact.

In order to avoid having glitches, said digital signal is processed according to the steps described below. The following assumptions are made.

A glitch G has a known maximum duration, which is 10 ns in the case of the application given by way of example. It could be 2 ns in faster systems.

A glitch G has a duration which is small compared with the duration of a high or low state on the input signal INPUT(G). In general, a glitch G will be less than 10 ns. Here, in the application given by way of example, it lasts for 5 ns and a high or low state must remain stable for 15,600 ns.

No external clock is used.

In addition, firstly, it is assumed that a single glitch G appears between two edges of the input signal.

It should be noted that, in order to know the duration of a glitch G for a certain application, it is necessary to carry out tests in the laboratory, known to persons skilled in the art, using verification means such as an oscilloscope and such as compiled code included in the module RTC, said compiled code generally being in a processor (not shown), said processor controlling said module RTC in a manner known to persons skilled in the art.

In a first step, when the digital filter FILT receives a digital input signal INPUT(G), the delay line T delays this digital signal by a delay Δt greater than or equal to the duration of a glitch G. The duration of the delay Δt is preferably 10 ns for the application given by way of example, i.e. that of the mobile. As can be seen in FIG. 2, a delayed digital signal INPUT(G)+Δt is obtained.

In a second step, the rising edge and falling edge detectors PD and ND detect a rising edge or a falling edge from said delayed digital input signal INPUT(G)+Δt. Thus, as can be seen in FIG. 2, at time t1, the rising edge detector PD detects a rising edge on the delayed input signal INPUT(G)+Δt and subsequently produces a rising edge indicator signal P containing a first pulse P1. The same applies at time t5 and at time t3; the rising edge indicator signal P contains two other pulses P2 and P3, the rising edge detected at time t3 corresponding here to a glitch G. Likewise, the falling edge detector ND detects at time t2 a falling edge on the delayed input signal INPUT(G)+Δt and subsequently produces a falling edge indicator signal N containing a first pulse N1. The same applies at time t4 and t6; the falling edge indicator signal N contains two other pulses N2 and N3, the falling edge detected at time t4 corresponding to a glitch G. Each pulse of a rising edge indicator signal P or of a falling edge indicator signal N has a minimum duration equal to 1 ns for the application given by way of example. For more safety, it is possible to take a duration of 3 ns.

In a third step, the first mixing means M1 produce a rising edge indicator filter signal P' from the input signal INPUT(G) and the rising edge indicator signal P. Said first mixing means M1 fulfill a logic AND function. Thus, as can be seen in FIG. 2, the rising edge indicator filter signal P' contains two pulses P1' and P3', results of the logic AND function, respectively at times t1 and t5. In the same way, the second mixing means M2 produce a falling edge indicator filter signal N' from the input signal INPUT (G) and from the falling edge indicator signal N. Said second mixing means M2 also fulfill a logic AND function from an inverted input signal INPUT(G). They therefore fulfill an inverting function together with a logic AND function. Thus the falling edge indicator filter signal N' contains three pulses N1', N2' and N3', results of the logic AND function, respectively at times t2, t4 and t6. The duration of the pulses of the filter signals P' or N' is equal to that of the pulses of the rising or falling edge indicator signals P or N.

It should be noted that the logic AND function between the input signal INPUT(G) and the edge indicator signals P and N is effective, i.e. makes it possible to eliminate a pulse from one or other of said edge indicator signals, a pulse corresponding to a glitch G, only if said edge indicator signals P or N are sufficiently delayed. This means that the delay Δt must be equal to at least the maximum duration of a glitch G.

This is because, should the delay Δt be less than the maximum duration of a glitch G, the logic AND function between the input signal INPUT(G) and the edge indicator signals would not make it possible to eliminate a pulse from one or other of said edge indicator signals, a pulse corresponding to a glitch G. Hence the need not only to delay the rising and falling edge indicator signals P and N with respect to the digital input signal INPUT(G) and consequently with respect to the glitches G, but also to verify the duration of the delay Δt.

Thus, from the rising and falling edge indicator signals P and N, there are obtained rising and falling edge indicator filter signals P' and N' which are active respectively only on the high and low states of the digital input signal INPUT(G).

In a last step, the rising and falling edge indicator filter signals P' and N' are used to produce an output signal OUTPUT with any glitch G removed. Thus the third mixing means M3 receive as an input the rising and falling edge indicator filter signals P' and N'. When a pulse of the rising edge filter signal P' appears, said third mixing means M3 set the output signal OUTPUT to one. The output signal OUTPUT remains in a high state as long as there is no falling edge filter signal pulse N'. As soon as there is a falling edge filter signal pulse N', the third mixing means M3 set the output signal OUTPUT to zero. The output signal OUTPUT remains in a low state as long as there is no rising edge filter signal pulse P'.

Thus, as can be seen in FIG. 2, at time t1, the rising edge indicator filter signal P' includes a first pulse P1'. Thus the output signal OUTPUT is set to one. At time t2, the falling edge indicator filter signal N' contains a first pulse N1'. Thus the output signal OUTPUT is set to zero. At time t4, the falling edge indicator filter signal N' contains a second pulse N2'. The output signal OUTPUT still remains in a low state. At time t5, the rising edge indicator filter signal P' contains a second pulse P3'. Thus the output signal OUTPUT is set to one. At time t6, the falling edge indicator filter signal N' contains a third pulse N3'. Thus the output signal OUTPUT is set to zero. Thus a digital output signal OUTPUT is obtained, which is equivalent to the digital input signal INPUT(G), delayed by a delay Δt and with no glitch G.

Thus, in the context of the application described, i.e. the mobile telephone clock, the time given is exact.

It should be noted that the fact that the output signal OUTPUT is delayed with respect to the input signal INPUT (G) is not a problem since the delay is only a few nanoseconds. This delay is fully acceptable for the functioning of a module. In addition, in the application given by way of example, it is the output signal OUTPUT which serves as a reference for the other signals used by the module such as the signal generated by the squared signal generator CLK. This signal gives the pulses for all internal communications in the module RTC. Thus the delay is not perceived by any of the internal signals.

Moreover, it should be noted that, contrary to the assumption which was made initially on the presence of a single glitch between two edges, it may happen that a succession of glitches in the digital input signal INPUT(G) may appear. This occurs when a digital signal oscillates greatly after having changed state. This is because a digital signal may exhibit oscillations on these high or low states. When it is transformed into a digital input signal INPUT(G), the oscillations result in several glitches close together until said corresponding oscillations are damped. Where there is such a succession of glitches G as depicted in FIG. 3, it suffices to increase the duration of the delay Δt so that said delay is greater than or equal to all the duration of damping of the oscillations.

It will be noticed that an edge effect phenomenon may occur if a glitch G arrives just before a rising or falling edge of the digital input signal INPUT(G). As can be seen in FIG. 4, in this case, the glitch G may be merged with the rising and falling edge, which has the effect of making the rising or falling edge of the corresponding output signal OUTPUT appear too soon, here a rising edge at time t3 instead of time t5. This phenomenon appears only if the delay between the end of a glitch and the next rising or falling edge of the input signal INPUT(G) is less than the delay Δt, which is rare. However, if the phenomenon occurs, this does not change the functioning of the module RTC since the output signal OUTPUT contains an average frequency of a clock signal equal to that of the input signal INPUT(G).

In a non-limiting embodiment illustrated in FIG. 5, the digital filter FILT is constructed as follows.

The delay line T contains an even number of inverters INV, sufficient to create a delay of a duration Δt. Here each inverter INV has a delay equal to Δt/4. The even number makes it possible to obtain a non-inverted delayed input signal INPUT(G)+Δt.

The rising edge detector PD comprises a flip-flop D1 with asynchronous reset and a connection of inverters INV from its output Q to its reset input R. The input D is always at 1. It is supplied by a supply VDD. The flip-flop D1 triggers at each rising edge of the delayed input signal INPUT(G)+Δt. There is normally a table of correspondence as follows.

| H | D | Q | R |
|---|---|---|---|
| Rising edge | 1 | 1 | 0 |

As can be seen in FIG. 5, the connection includes an odd number of inverters INV. Thus the signal at the output Q is inverted and the reset input R is active only at 0. When the signal on the output Q is at 1, after the propagation time through the inverters INV, this causes an asynchronous reset of the flip-flop D1. The output Q returns to 0. The flip-flop D1 therefore generates a pulse whose duration is equal to the propagation time of the inverters INV.

The falling edge detector ND comprises an asynchronous flip-flop D2, an odd number of inverters INV at the output and an inverter INV at the input of its input H. This inverter at the input enables said flip-flop D2 to trigger at each falling edge of the delayed input signal INPUT(G)+Δt. The flip-flop D2 functions in the same way as the flip-flop D1 presented above.

It should be noted that the duration of each pulse of a rising edge indicator signal P or of a falling edge indicator signal N must be of sufficient duration to cause a change of state of the third mixing means M3. It is for this reason that said duration must be at a minimum equal to 1 ns for the application as described previously.

The first mixing means M1 include a logic gate AND1 fulfilling a logic AND function. Said first means M1 receive as an input the non-delayed digital input signal INPUT(G) and the rising edge indicator signal P.

The second mixing means M2 include a logic gate AND2 fulfilling a logic AND function and an inverter INV at the input of the logic gate AND2. Said second means M2 receive as an input the non-delayed digital input signal INPUT(G) and the falling edge indicator signal P'.

The third mixing means M3 are an RS flip-flop. This RS flip-flop receives at its input S the rising edge indicator filter signal P' and at its input R the falling edge indicator filter signal N'. Said flip-flop comprises a table of correspondence as follows.

| S | R | Q | $\overline{Q}$ | |
|---|---|---|---|---|
| 0 | 0 | Q | $\overline{Q}$ | (keeps its state) |
| 0 | 1 | 0 | 1 | |
| 1 | 0 | 1 | 0 | |
| 1 | 1 | X | X | (inhibited state) |

FIG. 5 depicts solely the output Q which is of interest and which produces the output signal OUTPUT without a glitch G.

In the extreme case where there are several glitches G between two edges, this problem can certainly be resolved by putting in cascade as many filters as there are glitches G, each filter certainly eliminating at least one glitch G. The input of a filter corresponds in this case to the output of the previous filter.

Thus the digital filter which is the object of the invention claimed has the advantage of producing a signal without a glitch G, a glitch G less than the delay Δt being eliminated and this in a simple fashion, without using complex analog means such as capacitors or resistors. Thus there are used only arrangements of transistors with flip-flops and logic gates supplied by libraries well known to persons skilled in the art. There is no analog equipment. Consequently there is no need to have recourse to a routing positioning unit to know the delays and distances between two gates.

In addition, no external clock has been used.

Naturally, the context of the invention is in no way limited to the embodiments described above and variations or modifications can be made thereto without departing from the spirit and scope of the invention.

Naturally, the invention is in no way limited to the field of mobile telephony, and may extend to other fields, in particular to all those which use a digital filter in modules such as ASICs or FPGA programmable chips, such as "bluetooth" domains, wireless networks, imaging, military equipment etc.

No reference sign in the present text should be interpreted as limiting said text.

The verb "comprise" and its conjugations must also not be interpreted limitingly, i.e. they must not be interpreted as excluding the presence of steps or elements other than those defined in the description, or as excluding a plurality of steps or elements already listed after said verb and preceded by the article "a" or "an".

The invention claimed is:

1. A digital filter suitable for receiving a digital input signal (INPUT(G)), comprising a rising edge detector (PD), a falling edge detector (ND), a delay line (T) adapted to delay said digital input signal (INPUT(G)) and to produce a delayed digital input signal (INPUT(G)+Δt), said digital input signal (INPUT(G)) comprising a voltage peak also known as glitch, wherein:

the rising edge detector (PD) is adapted to produce a rising edge indicator signal (P) from the delayed digital input signal (INPUT(G)+Δt), the falling edge detector (ND) is adapted to produce a falling edge indicator signal (N) from the delayed digital input signal (INPUT(G)+Δt), first mixing means (M1) adapted to produce a rising edge filter indicator signal (P') from said digital input signal (INPUT(G)) and said rising edge indicator signal (P), second mixing means (M2) adapted to produce a falling edge filter indicator signal (N') from said digital input signal (INPUT(G)) and said falling edge indicator signal (N), and third mixing means (M3) adapted to produce a digital output signal (OUTPUT) without a glitch, having a duration no greater than delay Δt, from the rising edge filter indicator signal (P') and the falling edge filter indicator signal (N').

2. A digital filter as claimed in claim 1, wherein the first mixing means (M1) fulfill a logic AND function, and the second filtering means (M2) fulfill an inverting function along with a logic AND function.

3. A digital filter as claimed in claim 1, wherein the third filtering means (M3) is an RS flip-flop.

4. A digital filter as claimed in claim 1, wherein the rising edge (PD) and falling edge (ND) detectors are D flip-flops having a connection of inverters (INV) from an output (Q) to a reset input (R).

5. A method of filtering a digital signal (INPUT(G)) comprising a glitch, the method comprises the steps of:

delaying said digital input signal (INPUT(G)) and producing a delayed digital input signal (INPUT(G)+Δt), detecting a rising edge coming from the delayed digital input signal (INPUT(G)+Δt) and producing a rising edge indicator signal (P), detecting a falling edge coming from the delayed digital input signal (INPUT(G)+Δt) and producing a falling edge indicator signal (N), producing a rising edge filter indicator signal (P') from said digital input signal (INPUT(G)) and said rising edge indicator signal (P), producing a falling edge filter indicator signal (N') from said digital input signal (INPUT(G)) and said falling edge indicator signal (N), and producing a digital output signal (OUTPUT) without a glitch, having a duration no greater than delay Δt, from the rising edge filter indicator signal (P') and the falling edge filter indicator signal (N').

6. A module (RTC) comprising a squared signal generator (CLK) transforming an analog signal into a digital input signal (INPUT(G)), comprises:

a digital filter as claimed in claim 1 suitable for receiving said digital input signal (INPUT(G)).

7. A portable telephone comprising a module (RTC) as claimed in claim 6.

* * * * *